(12) United States Patent
Rana

(10) Patent No.: US 7,858,427 B2
(45) Date of Patent: Dec. 28, 2010

(54) CRYSTALLINE SILICON SOLAR CELLS ON LOW PURITY SUBSTRATE

(75) Inventor: Virendra V. Rana, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 116 days.

(21) Appl. No.: 12/396,909

(22) Filed: Mar. 3, 2009

(65) Prior Publication Data
US 2010/0227431 A1    Sep. 9, 2010

(51) Int. Cl.
*H01L 21/00* (2006.01)
*H01L 31/042* (2006.01)
*H01L 21/20* (2006.01)

(52) U.S. Cl. .................. 438/64; 438/584; 438/48; 136/246; 257/E31.001; 257/E25.009

(58) Field of Classification Search ............... 438/584, 438/64, 48, 57; 136/256, 252, 246; 257/431, 257/458, E31.001, E25.009
See application file for complete search history.

(56) References Cited

U.S. PATENT DOCUMENTS

| | | | |
|---|---|---|---|
| 3,990,101 A | 11/1976 | Ettenberg et al. | |
| 4,064,521 A | 12/1977 | Carlson | |
| 4,124,410 A | 11/1978 | Kotval et al. | |
| 4,167,015 A | 9/1979 | Hanak | |
| 4,234,352 A | 11/1980 | Swanson | |
| 4,317,844 A | 3/1982 | Carlson | |
| 4,366,335 A | 12/1982 | Feng et al. | |
| 4,377,723 A | 3/1983 | Dalal | |
| 4,383,268 A | 5/1983 | Martinelli et al. | |
| 4,388,482 A | 6/1983 | Hamakawa et al. | |
| 4,434,318 A | 2/1984 | Gibbons | |
| 4,459,163 A | 7/1984 | MacDiarmid et al. | |
| 4,468,853 A | 9/1984 | Morita et al. | |
| 4,478,879 A | 10/1984 | Baraona et al. | |

(Continued)

FOREIGN PATENT DOCUMENTS

EP        04 26239        5/1991

(Continued)

OTHER PUBLICATIONS

Bernreuter J., "High, Higher, the Highest", Photon International No. 5, pp. 48-52, Solar Verlag GmbH, May 2003.

(Continued)

*Primary Examiner*—Walter L Lindsay, Jr.
(74) *Attorney, Agent, or Firm*—Patterson & Sheridan, LLP

(57) ABSTRACT

A method is provided for making a crystalline silicon solar cell on a low purity substrate by depositing p+-p-n+, or n+-n-p+ layers of amorphous silicon, depending on the type of wafer, on a crystalline silicon substrate, such as an upgraded metallurgical grade silicon substrate, with substrate vias of varying diameters formed thereon, annealing the stack of amorphous silicon layers to cause solid phase epitaxial crystallization, and metallizing the substrate assembly using standard metallization techniques. One embodiment of the present invention provides depositing a passivation layer onto the third deposited silicon layer subsequent to the crystallization. Another embodiment provides depositing a passivation layer on the back side of the substrate subsequent to crystallization and punching selected regions at the substrate vias prior to back metallization.

24 Claims, 6 Drawing Sheets

U.S. PATENT DOCUMENTS

| | | | |
|---|---|---|---|
| 4,496,788 | A | 1/1985 | Hamakawa et al. |
| 4,525,593 | A | 6/1985 | Yablonovitch |
| 4,536,607 | A | 8/1985 | Wiesmann |
| 4,642,414 | A | 2/1987 | Rasch et al. |
| 4,818,337 | A | 4/1989 | Barnett et al. |
| 4,927,770 | A | 5/1990 | Swanson |
| 5,001,782 | A | 3/1991 | Stewart |
| 5,030,295 | A | 7/1991 | Swanson et al. |
| 5,053,083 | A | 10/1991 | Sinton |
| 5,057,439 | A | 10/1991 | Swanson et al. |
| 5,064,779 | A | 11/1991 | Hasegawa |
| 5,066,340 | A | 11/1991 | Iwamoto et al. |
| 5,114,498 | A | 5/1992 | Okamoto et al. |
| 5,213,628 | A | 5/1993 | Noguchi et al. |
| 5,217,921 | A | 6/1993 | Kaido et al. |
| 5,228,338 | A | 7/1993 | Saghatchi |
| 5,395,457 | A | 3/1995 | Sano et al. |
| 5,401,336 | A | 3/1995 | Noguchi et al. |
| 5,418,019 | A | 5/1995 | Chen et al. |
| 5,419,783 | A | 5/1995 | Noguchi et al. |
| 5,449,626 | A | 9/1995 | Hezel |
| 5,455,430 | A | 10/1995 | Noguchi et al. |
| 5,532,175 | A | 7/1996 | Racanelli et al. |
| 5,575,862 | A | 11/1996 | Nishida |
| 5,589,008 | A | 12/1996 | Keppner |
| 5,648,675 | A | 7/1997 | Terada et al. |
| 5,693,957 | A | 12/1997 | Sano et al. |
| 5,705,828 | A | 1/1998 | Noguchi et al. |
| 5,738,731 | A | 4/1998 | Shindo et al. |
| 5,871,591 | A | 2/1999 | Ruby et al. |
| 5,935,344 | A * | 8/1999 | Endo et al. .................. 136/255 |
| 5,942,050 | A | 8/1999 | Green et al. |
| 6,077,722 | A | 6/2000 | Jansen et al. |
| 6,091,021 | A | 7/2000 | Ruby et al. |
| 6,207,890 | B1 | 3/2001 | Nakai et al. |
| 6,228,732 | B1 | 5/2001 | Richardson et al. |
| 6,309,906 | B1 | 10/2001 | Meier et al. |
| 6,380,478 | B1 | 4/2002 | Yamamoto et al. |
| 6,380,479 | B2 | 4/2002 | Nakai et al. |
| 6,534,784 | B2 | 3/2003 | Eliasson et al. |
| 6,538,195 | B1 | 3/2003 | Shi et al. |
| 6,552,414 | B1 | 4/2003 | Horzel et al. |
| 6,638,838 | B1 | 10/2003 | Eisenbeiser et al. |
| 6,670,542 | B2 * | 12/2003 | Sakata et al. ................. 136/258 |
| 6,700,057 | B2 | 3/2004 | Yasuno |
| 6,815,788 | B2 | 11/2004 | Oka et al. |
| 6,818,820 | B2 | 11/2004 | Matsushita et al. |
| 6,825,104 | B2 | 11/2004 | Horzel et al. |
| 6,830,740 | B2 | 12/2004 | Oki et al. |
| 6,835,888 | B2 | 12/2004 | Sano et al. |
| 6,844,248 | B2 | 1/2005 | Naseem et al. |
| 6,844,568 | B2 | 1/2005 | Seki et al. |
| 6,846,984 | B2 | 1/2005 | Fath et al. |
| 6,858,791 | B2 | 2/2005 | Erban |
| 6,878,921 | B2 | 4/2005 | Taguchi et al. |
| 6,998,288 | B1 | 2/2006 | Smith et al. |
| 7,030,413 | B2 | 4/2006 | Nakamura et al. |
| 7,074,641 | B2 | 7/2006 | Kondo et al. |
| 7,129,109 | B2 | 10/2006 | Munzer et al. |
| 7,301,215 | B2 | 11/2007 | Kariya |
| 7,339,110 | B1 | 3/2008 | Mulligan et al. |
| 7,388,147 | B2 | 6/2008 | Mulligan et al. |
| 7,402,448 | B2 | 7/2008 | Narayanan et al. |
| 2001/0029978 | A1 | 10/2001 | Nakai et al. |
| 2003/0127641 | A1 | 7/2003 | Eliasson et al. |
| 2003/0168578 | A1 | 9/2003 | Taguchi et al. |
| 2004/0058468 | A1 | 3/2004 | Takahashi et al. |
| 2004/0106227 | A1 | 6/2004 | Naseem et al. |
| 2004/0112426 | A1 | 6/2004 | Hagino |
| 2004/0259335 | A1 * | 12/2004 | Narayanan et al. .......... 438/584 |
| 2005/0062041 | A1 | 3/2005 | Terakawa et al. |
| 2005/0133084 | A1 | 6/2005 | Joge et al. |
| 2006/0157103 | A1 * | 7/2006 | Sheats et al. ................. 136/244 |
| 2006/0219292 | A1 | 10/2006 | Asaumi et al. |
| 2006/0255340 | A1 | 11/2006 | Manivannan et al. |
| 2006/0283496 | A1 | 12/2006 | Okamoto et al. |
| 2007/0151599 | A1 | 7/2007 | Cousins |
| 2007/0249085 | A1 | 10/2007 | Ojima et al. |
| 2007/0256728 | A1 | 11/2007 | Cousins |
| 2008/0023068 | A1 | 1/2008 | Nakashima et al. |
| 2008/0057220 | A1 | 3/2008 | Bachrach et al. |
| 2008/0169019 | A1 * | 7/2008 | Korevaar et al. ............. 136/251 |
| 2008/0271780 | A1 * | 11/2008 | Narayanan et al. .......... 136/255 |
| 2009/0026423 | A1 | 1/2009 | Kirscht et al. |
| 2010/0206371 | A1 * | 8/2010 | Janz et al. .................... 136/256 |

FOREIGN PATENT DOCUMENTS

| | | |
|---|---|---|
| WO | WO-2006 122774 | 11/2006 |
| WO | WO-2007 053016 | 5/2007 |
| WO | WO-2007 130188 | 11/2007 |

OTHER PUBLICATIONS

Erler, et al. "Solar cell processing steps applied on RIE textured silicon surfaces", Chemnitz University website located at: www.zfm.tu-chemitz.de/pdf/annual_report_2002/special_report_17.pdf.

Green et al., "Solar Cell Efficiency Tables (Version 31)", Prog. Photovolt: Res. Appl. 2008; vol. 16, pp. 61-67.

Green, Martin A., "Silicon Photovoltaic Modules: A Brief History of the First 50 Years", Prog. Photovolt: Res. Appl. 2005; vol. 13, pp. 447-455.

International Search Report and Written Opinion dated Nov. 13, 2008 for PCT/US 08 74929 (012705 PCP).

Klein S., et al "High Efficiency Thin Film Solar Cells with Intrinsic Microcrystalline Silicon Prepared by Hot Wire CVD" Mat. Res. Soc. Symp. Proc. vol. 715 @ 2002 Materials Research Society, pp. A26.2.1-A 26.2.6.

Klein S., et al. "Microcrystalline Silicon Prepared by Hot-Wire Chemical Vapor Deposition for Thin Film Solar Cell Applications", Jpn J. Appl. Phys. vol. 41(2002)pp. L 10-12, Jan. 2002.

Kwark et al., "Low Jo Contact Structures Using Sipo and Polysilicon Films", Solid State Laboratory, Stanford University, Stanford, CA; 0160-8371/85/0000-0787 IEEE 1985; pp. 787-791.

Lindholm et al., "Heavily Doped Polysilicon-Contact Solar Cells," IEEE Electron Device Letters, vol. EDL-6, No. 7, pp. 363-365, Jul. 1985, IEEE, New York, USA.

Matsushita et al., "A Silicon Heterojunction Translator", Appl. Physi. Lett., vol. 35, No. 7, Oct. 1, 1979, pp. 549-550.

McIntosh, et al., "The Choice of Silicon Wafer for the Production of Low-Cost Rear-Contact Solar Cells", 3rd World Conference on Photovoltaic Energy Conversion, May 11-18, 2003, Osaka, Japan, pp. 971-974.

Richardson, William F., "The Fabrication and Evaluation of a Silicon Photovoltaic Cell with a Directly Nitrided Tunnel Insulator", A Dissertation Presented to the Faculty of the Graduate School University of Missouri-Columbia, May 1981.

Tanaka et al., "Development of Hit Solar Cells with more than 21% Conversion Efficiency and Commercialization of Highest Performance Hit Modules", 3rd World Conference on Photovoltaic Energy Conversion, May 11-18, 2003, Osaka, Japan, pp. 955-958.

Tarr, N. Garry, "A Polysilicon Emitter Solar Cell", IEEE Electron Device Letters, vol. EDL-6, No. 12, Dec. 1985, pp. 655-658.

Ujjwal K. Das et al "Amorphous and Microcrystalline Silicon Solar Cells Grown by Pulsed PECVD Technique", Mat. Res. Soc. Symp. Proc. vol. 715 @ 2002 Materials Research Society pp. A. 26.6.1-A 26.6.6.

Van Halen et al., "High-Gain Bipolar Transistors with Polysilicon Tunnel Junction Emitter Contacts", IEEE Transactions on Electron Devices, vol. ED-32, No. 7, Jul. 1985, pp. 1307-1313.

* cited by examiner

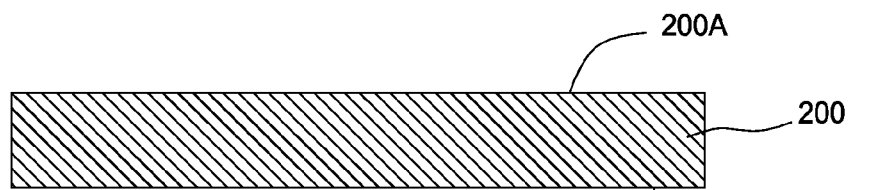
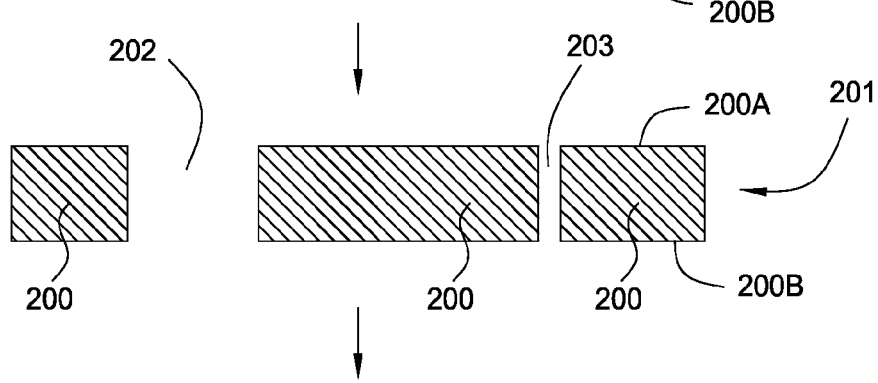
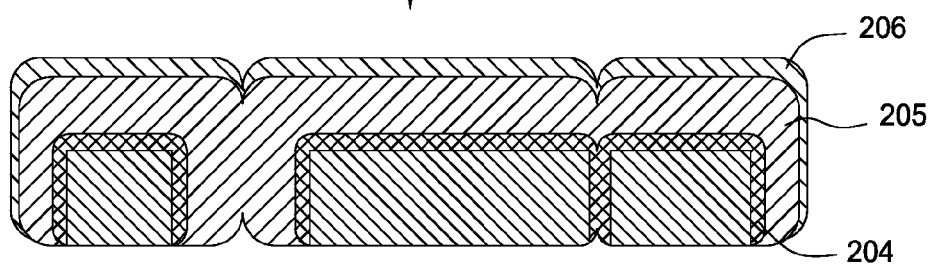
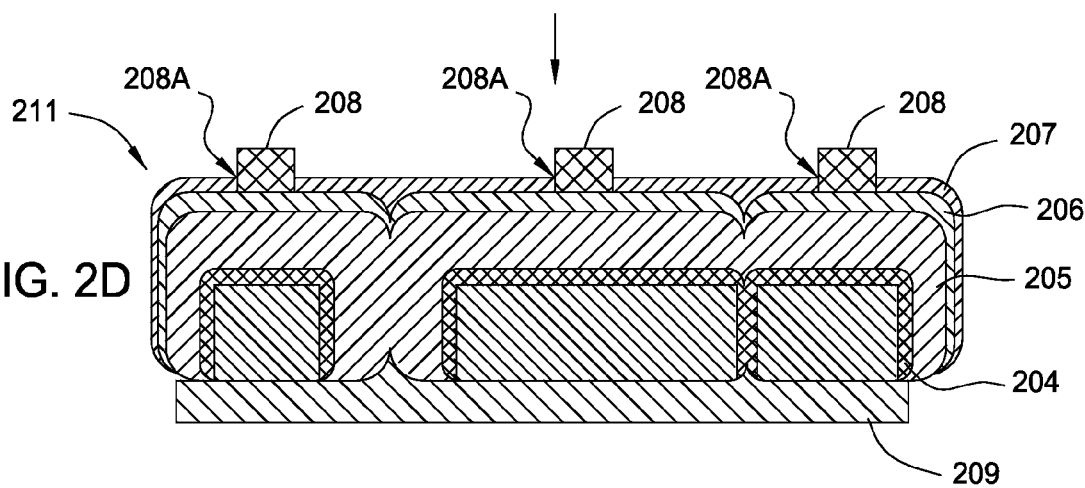
FIG. 2A
FIG. 2B
FIG. 2C
FIG. 2D

CRYSTALLINE SILICON SOLAR CELLS ON LOW PURITY SUBSTRATE

BACKGROUND OF THE INVENTION

1. Field of the Invention

Embodiments of the present invention generally relate to the field of photovoltaic device manufacture and, more specifically, to a method for making crystalline silicon solar cells on low purity substrates.

2. Description of the Related Art

Solar cells are photovoltaic devices that convert sunlight directly into electrical power. The most common solar cell material is crystalline silicon, which is in the form of single or multicrystalline substrates, commonly referred to as wafers. Because the amortized cost of forming crystalline silicon-based solar cells to generate electricity is higher than the cost of generating electricity using traditional methods, there has been an effort to reduce the cost to form solar cells.

The present invention relates to the development of methods to enable the use of low-cost silicon materials for use in solar cells. Generally, in order to obtain good efficiency in crystalline silicon (c-Si) solar cells, high purity polysilicon is used as a starting material. The purity of the silicon is related to the ability of electrons to travel freely and therefore affects efficiency in relation to the conversion of photons in the solar process. Although the level of purity of the silicon required for solar cells is not as great as that necessary for electronic grade silicon used in semiconductor fabrication (close to 99.9999999%, with impurities in the parts per billion range), a high degree of silicon purity (99.9999% or better, with maximum impurity concentration in the parts per million range) is still required.

Typically, high purity polysilicon is obtained by purifying metallurgical grade silicon (MG-Si) using the "Siemens process." The Siemens process for purifying silicon is commonly used because it removes boron and phosphorus impurities from silicon better than other known methods. In the Siemens process, high-purity silicon rods are exposed to trichlorosilane (or silane) at 1150° C. The trichlorosilane (or silane) gas decomposes and deposits additional silicon onto the rods. Silicon produced from this process is called polycrystalline silicon and typically has impurity levels in the parts per billion range, or $10^{13}$ atoms/cm$^3$.

The Siemens process is very expensive and accounts for a major component of the cost of the wafers used to form crystalline silicon solar cells. Upgraded metallurgical grade (UMG) silicon refers to a type of silicon with higher boron or phosphorus impurities but with other harmful impurities such as heavy metals in the parts per million range or better, and is less expensive to manufacture than high purity polysilicon. If UMG silicon, containing higher levels of boron or phosphorus impurities than the silicon produced by the Siemens process, could be used, then less expensive processes could be used to purify the metallurgical grade silicon, thereby lowering the cost of making solar cells.

Therefore, there is a need for a method of making crystalline silicon solar cells on less expensive, low purity UMG substrates.

SUMMARY OF THE INVENTION

The present invention generally relates to a method for making crystalline silicon solar cells on low purity substrates.

In one embodiment, a method is provided for forming a crystalline silicon solar cell comprising forming vias of two different diameters through a crystalline silicon substrate from a first surface to a second surface, depositing a first silicon layer on the first surface and on surfaces within the vias, wherein the first silicon layer fills the vias of lesser diameter, depositing a second silicon layer over the first silicon layer, wherein the second silicon layer fills the vias of greater diameter, depositing a third silicon layer over the second silicon layer, and depositing a metallization layer on the second surface of the substrate. In one embodiment, the method further includes depositing a passivation layer on the third silicon layer prior to metallization and forming metal contacts on selected areas of the third silicon layer. In one embodiment, the passivation layer is formed from a compound selected from the group consisting of silicon nitride and silicon oxide. In another embodiment, the crystalline silicon substrate is a p-type silicon substrate, the first silicon layer is a p+-type amorphous silicon layer, the second silicon layer is a p-type amorphous silicon layer, and the third silicon layer is an n+-type amorphous silicon layer. In yet another embodiment, the method further comprises annealing the crystalline silicon substrate, prior to depositing the metallization layer and forming the metal contacts, at a temperature sufficient to cause crystallization of the first, second and third silicon layers and to electrically activate dopants in the layers. In another embodiment, the vias are formed by laser ablation. In one example, the vias of two different diameters comprise a first via having a diameter of about 4 to about 15 microns and a second via having a diameter of about 40 to about 60 microns. In a further embodiment, the second silicon layer is about 20 to 30 microns thick. In another example, the method further comprises removing saw damage from the substrate surfaces and texture etching the crystalline silicon substrate prior to forming the vias. In another embodiment, the crystalline silicon substrate comprises an upgraded metallurgical grade crystalline silicon substrate having a concentration of boron or phosphorus of about $1\times10^{16}$ atoms/cm$^3$ to about $1\times10^{19}$ atoms/cm$^3$.

In another embodiment, a method is provided for forming a crystalline silicon solar cell comprising forming vias of two different diameters through a crystalline silicon substrate from a first surface to a second surface, depositing a first silicon layer on the first surface of the crystalline silicon substrate and on surfaces within the vias, wherein the first silicon layer fills vias of lesser diameter, depositing a second silicon layer on the first silicon layer, depositing a third silicon layer on the second silicon layer, wherein the third silicon layer fills vias of greater diameter, depositing a passivation layer on the second surface of the substrate, patterning the passivation layer to expose portions of the first silicon layer and the third silicon layer, and depositing a conductive layer over the patterned passivation layer so that the conductive layer makes contact with the exposed regions of the first silicon layer in the vias of lesser diameter and the third silicon layer in the vias of greater diameter. In another example, the method further comprises annealing the substrate, prior to depositing the passivation layer and depositing the conductive layer, at a temperature sufficient to cause crystallization of the first, second and third silicon layers and to electrically activate dopants in the layers. In one embodiment, the method further comprises depositing a second passivation layer on the third silicon layer after annealing. In another embodiment, the second passivation layer comprises two or more layers. In another embodiment, either of the layers of the second passivation layer is formed from a compound selected from the group consisting of silicon nitride and silicon oxide. In yet another embodiment, the crystalline silicon substrate is a p-type silicon substrate, the first silicon layer is a p+-type amorphous silicon layer, the second silicon layer is a p-type amorphous silicon layer and the third silicon layer is an n+-type amorphous silicon layer. In another embodiment, the crystalline silicon substrate comprises an upgraded metallurgical grade crystalline silicon substrate having a concentration of boron or phosphorus of about $1\times10^{16}$ atoms/cm$^3$ to about $1\times10^{19}$ atoms/cm$^3$.

In another embodiment, a method is provided for forming a crystalline silicon solar cell comprising forming vias of two different diameters through a crystalline silicon substrate from a first surface to a second surface, depositing a first silicon layer over the first surface of the crystalline silicon substrate and on surfaces within the vias, wherein the first silicon layer fills vias of lesser diameter, depositing a second silicon layer over the first silicon layer, depositing a third silicon layer over the second silicon layer, wherein vias of greater diameter remain open after deposition of the first, second and third silicon layers, depositing a passivation layer over the second surface of the crystalline silicon substrate, patterning the passivation layer to expose regions of the first silicon layer and the third silicon layer, and depositing a conductive layer over the patterned passivation layer so that the conductive layer contacts the exposed regions of the first silicon layer in the vias of lesser diameter and the third silicon layer in the vias of greater diameter. In one embodiment, the method further comprises depositing a second passivation layer on the third silicon layer prior to deposition of the passivation layer over the second surface. In one embodiment, the second passivation layer comprises two or more layers. In one embodiment, the second passivation layer is formed from a compound selected from the group consisting of silicon nitride and silicon oxide. In another embodiment, the first layer is a p+-type amorphous silicon layer, the second layer is a p-type amorphous silicon layer, and the third layer is a n+-type amorphous silicon layer. In another embodiment, the method further comprises annealing the substrate, prior to depositing the passivation layer and depositing the conductive layer, at a temperature sufficiently low to cause solid phase epitaxial crystallization of the first, second, and third silicon layers and to electrically activate dopants in the layers. In yet another embodiment, the crystalline silicon substrate comprises an upgraded metallurgical grade crystalline silicon substrate having a concentration of boron or phosphorus of about $1\times10^{16}$ atoms/cm$^3$ to about $1\times10^{19}$ atoms/cm$^3$.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2D illustrate schematic cross-sectional views of a solar cell substrate during different stages in the processing sequence shown in FIG. 1;

DETAILED DESCRIPTION

Embodiments of the present invention provide a method for making crystalline silicon solar cells on crystalline silicon substrates, such as upgraded metallurgical silicon (UMG) substrates, by depositing amorphous silicon p-type layer(s) and/or amorphous silicon n-type layer(s), on the crystalline silicon substrate with substrate vias, or through holes, of varying diameters formed therein, annealing the stack of amorphous silicon layers to cause solid phase epitaxial conversion, and metalizing the substrate assembly using standard metallization techniques. Additional embodiments of the present invention provide depositing a passivation layer onto the last deposited silicon layer subsequent to the conversion. In one embodiment, a first layer of deposited amorphous silicon fills the substrate vias having a smaller diameter while a second layer of deposited amorphous silicon fills the substrate vias of larger diameter. A sufficient number of larger sized vias are made to obtain sufficient contact area with a reflective metal, such as aluminum, to have good current flow from the solar cell to the backside metal. Also, it is advantageous to increase the contact area, i.e., the number of vias, so as to increase the reflected radiation from metal that increases the charge carrier generation and the collected current. The reflection by the back metal, such as aluminum, can be increased by increasing the number of substrate vias. In another embodiment, the larger diameter substrate vias are made slightly larger so that the second amorphous silicon layer is not able to fill up the substrate vias. In this embodiment, a subsequently deposited third layer of amorphous silicon of a different conductivity than the second silicon layer is able to reach the back surface of the substrate through the larger diameter vias. Therefore, in this configuration, since both the second and third silicon layers are available at the back of the substrate, interdigitated back contact (IBC) metallization techniques can be used to make cell contact, and no metallization is needed on the front. In yet another embodiment, the larger diameter substrate vias are made even larger so that neither the first, second nor third layers of amorphous silicon is able to fill up the substrate vias. This embodiment would also allow for back contact metallization.

In the foregoing embodiments, the second deposited silicon layer (which may be a p-type layer or an n-type layer, depending on the conductivity of the substrate) acts as the active part of the solar cell. Consequently, it is possible to use as the starting substrate upgraded metallurgical (UMG) silicon, which contains higher concentrations of boron or phosphorus that are typically not tolerated by solar cells that use the substrate itself for the photovoltaic activity.

Figure 1:
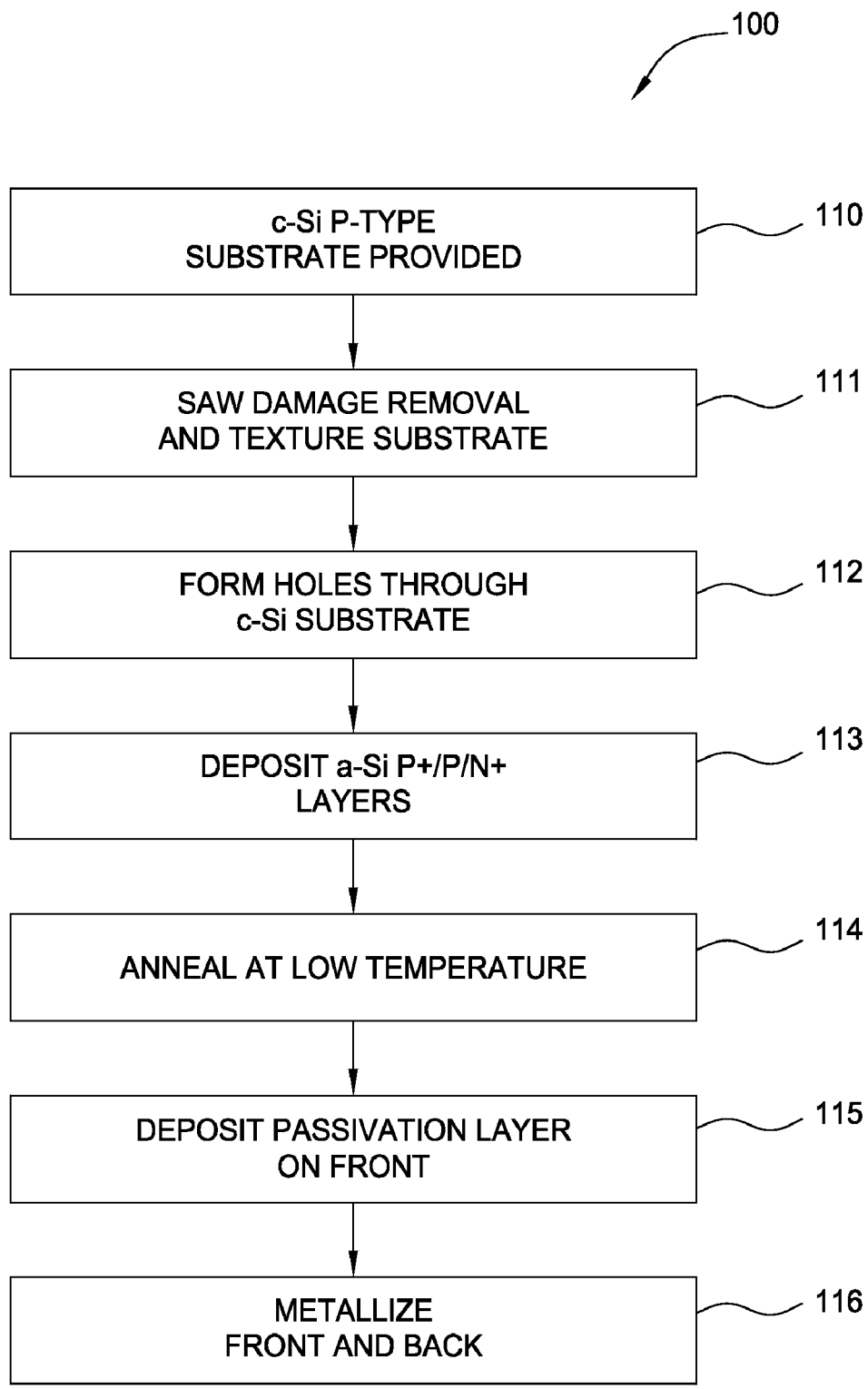
FIG. 1 is a process flow diagram showing the steps of one embodiment of a method of forming a solar cell in accordance with the principles of the present invention.

FIG. 1 depicts a process flow diagram illustrating one embodiment of a method of the present invention. FIGS. 2A-2D illustrate schematic cross-sectional views of substrate 200, such as a solar cell substrate, during different stages in processing sequence 100 discussed below in conjunction with FIG. 1. At step 110, substrate 200 (FIG. 2A), such as a crystalline silicon (c-Si) substrate, is provided. In one embodiment, the crystalline silicon substrate comprises an electronic grade substrate. In another embodiment, the crystalline silicon substrate comprises an upgraded metallurgical grade (UMG) crystalline silicon substrate. The upgraded metallurgical grade (UMG) silicon is relatively clean polysilicon raw material having a low concentration of heavy metals and other harmful impurities, preferably less than in the parts per million range, but which may contain a high concentration of boron or phosphorus, depending on the source. For example, UMG silicon may contain boron or phosphorus at a concentration of about $1\times10^{16}$ atoms/cm$^3$ to about $1\times10^{19}$ atoms/cm$^3$. In one example, UMG silicon may contain boron or phosphorus at a concentration of about $1\times10^{17}$ atoms/cm$^3$ to about $1\times10^{19}$ atoms/cm$^3$. In one embodiment, as shown at FIG. 1, a substrate 200 is used that contains higher levels of a p-type dopant, such as boron, than silicon produced by the Siemens process. While FIG. 1, and its associated discussion, primarily discusses the use of a p-type c-Si substrate, this configuration is not intended to be limiting as to the scope of the invention, since an n-type c-Si substrate may also be used without deviating from the basic scope of the embodiments of the invention described herein. It should be noted that the doping type of deposited layers formed over the substrate will vary based on the type of substrate that is used. The substrate 200 can be formed from single crystalline silicon (mono-Si) or multicrystalline silicon (MC-Si), depending on the particular application of the product to be produced. The substrate 200 may be of a thickness ranging from about 120 microns to about 200 microns.

In one embodiment, as shown at step 111, the substrate 200 may undergo saw damage removal and texturing to assist in the coupling of light energy into the solar cell, reduce surface reflectivity, and hence improve efficiency. The saw damage removal may be performed to remove the damage created during the sawing process using techniques known to those skilled in the art, such as caustic etching, other types of chemical etching, lapping, polishing or other similar techniques. In one embodiment, texturing of a single crystalline silicon substrate front surface may be done by chemical etching to create a textured surface with random pyramidal features. Depending on the type of wafer, texturing can also be done by a number of publicly-known alternative methods, including photolithography, acid etching, plasma etching, and mechanical abrasion. Following the texturing, the substrate 200 may be cleaned using a standard pre-diffusion wet cleansing sequence.

At step 112, a plurality of vias of one or more diameters is formed through the substrate 200. In one embodiment, substrate vias of two desired diameters may be formed. In FIG. 2B, only two substrate vias, larger substrate via 202 and smaller substrate via 203, are shown for clarity. In other embodiments, substrate vias of three, or more diameters may be formed. The larger substrate via 202 and smaller substrate via 203 may be drilled using laser ablation or water jet cutting techniques. However, any suitable technique known in the art for forming vias through a silicon wafer may be used to form the perforated substrate 201 (FIG. 2B).

At step 113, the substrate 200 is placed inside a vacuum deposition chamber. The vacuum deposition chamber may be a stand-alone chamber or part of a multi-chamber processing system. For example, the chamber may be a plasma enhanced chemical vapor deposition (PECVD) chamber. For a detailed illustration and explanation of one embodiment of a PECVD useful for carrying out embodiments of the present invention, reference is made to U.S. Pub. No. 2006/0060138 A1, which is incorporated in its entirety herein. A p-doped amorphous silicon layer with a heavy concentration of boron (p+-type layer 204) (FIG. 2C) is then deposited on a front surface 200A of the substrate 200 and on surfaces within the larger substrate via 202 and smaller substrate via 203. In one embodiment, the p+-type layer 204 of amorphous silicon is doped with boron to a concentration of about $1.5\times10^{21}$ atoms/cm$^3$. In one embodiment, it is desirable for the first p+-type layer 204 to fill the smaller substrate via 203. The term "fill" or "filling", as used herein, may include completely filling, as in the embodiment shown in FIG. 2C, wherein p+-type layer 204 completely fills smaller substrate via 203. Next, a lightly p-doped amorphous silicon layer (p-type layer 205) (FIG. 2C) is deposited on the first p+-type layer 204. In one embodiment, the p-type layer 205 of amorphous silicon is doped with boron to a concentration of about $1.5\times10^{16}$ atoms/cm$^3$. In this embodiment, it is generally desirable for the second p-type layer 205 to fill any larger substrate via 202 that has not already been filled by the first p+-type layer 204. A heavily n-doped amorphous silicon layer (n+-type layer 206) (FIG. 2C) is subsequently deposited on the second p-type layer 205. In one embodiment, the n+-type layer 206 of amorphous silicon is doped with phosphorus to a concentration of about $1.5\times10^{19}$ atoms/cm$^3$. The n+-type layer 206 will not reach the back surface 200B (FIG. 2B) of substrate 200. The n+-type layer 206 will provide the low contact resistance areas upon which front metal contacts can be deposited.

The desired diameters of the larger substrate via 202 and smaller substrate via 203 will depend upon the step coverage and desired film thicknesses of the deposited p+-type layer 204, p-type layer 205 and n+-type layer 206. In one embodiment, the p+-type layer 204 of amorphous silicon may be deposited at a film thickness from about 3 to 10 microns, the p-type layer 205 of amorphous silicon may be deposited at a film thickness from about 20 to 30 microns, and the n+-type layer 206 of amorphous silicon may be deposited at a film thickness from about 0.3 to 1 micron. In one embodiment, substrate vias of two different desired diameters are formed. In one embodiment, for a deposition process having 70% step coverage, the smaller substrate via 203 can have a desired diameter of approximately 4 to 15 microns, and the larger substrate via 202 can have a desired diameter of approximately 40 to 60 microns, so that the smaller substrate via 203 is filled by the first p+-type layer 204, while the larger substrate via 202 is filled by the second p-type layer 205. It should be noted that the step coverage, and hence the desired substrate via diameter, will vary depending on the deposition process. If the step coverage "s" of the amorphous silicon film is defined as the thickness of film on the vertical edge of the via divided by the thickness deposited on the horizontal top surface of the via, the minimum thickness "t" of the film to be deposited to completely fill a hole of radius "r" is given by t=r/s. Hence, the minimum thickness of the film, or the diameter of the via to be drilled, can be easily calculated.

At step 114, the substrate 200 and the three amorphous silicon layers, p+-type layer 204, p-type layer 205 and n+-type layer 206, may be directionally annealed at a temperature sufficient to crystallize the amorphous silicon layers and to electrically activate the dopants, but not so high as to cause the dopants, such as boron or phosphorus, or unwanted impurities to diffuse out of the substrate 200 beyond the p+-type layer and into the active part of the cell, which is the second, p-type layer 205. In one example, the p+-type layer 204, the p-type layer 205 and the n+-type layer 206 may be converted by solid phase epitaxy. In one embodiment, the conversion of the deposited p+-type layer 204, p-type layer 205 and n+-type layer 206 is accomplished by generating a temperature gradient across the substrate 200 with the deposited amorphous silicon layers thereon. The temperature gradient is provided at a temperature and for a time period sufficient to crystallize the amorphous material, such that, as the layers crystallize, they assume the same grain structure and crystal orientation as that of the underlying substrate 200.

Moreover, the temperature gradient is provided at a temperature low enough so that there is no penetration of impurities from the substrate into the active p-type layer.

In one embodiment of step 114, the substrate 200 has heat applied to the back surface 200B thereof, which is on the opposite side of the substrate from the front surface 200A on which the p+-type layer 204, p-type layer 205 and n+-type layer 206 are deposited. The heat may be applied in any manner such that the application of heat is controlled and limited to being supplied to the back surface 200B of the substrate 200. In one embodiment, heat is applied to the back surface 200B of the substrate 200 in a rapid thermal processing (RTP) chamber. Accordingly, heat is applied to the back surface 200B of the substrate 200 at a suitable temperature, such as between about 750° C. and about 1200° C., and over a suitable period of time, such as between about 5 seconds and about 30 minutes, across the silicon substrate to convert the amorphous silicon layers through solid phase epitaxy with little dopant diffusion. The directional heating technique described herein is not limited to rapid thermal processing. Other methods of subjecting a substrate to a temperature gradient may be used as well.

In one embodiment, the heat is applied to the back surface 200B of the substrate 200 at a temperature of about 750° C. to about 1200° C. for a time period of about 5 seconds to about 30 minutes. In one embodiment of the present invention, the heat is applied to the back surface 200B at a temperature of about 1000° C. for a period of about 30 seconds. In one embodiment, the heat is applied to the back surface 200B at a temperature of about 950° C. for a time period of about 120 seconds. In one embodiment, the heat is applied to the back surface 200B at a temperature of about 1000° C. for a time period of about 120 seconds.

The application of the temperature gradient for the short time period causes the amorphous silicon to crystallize starting at the interface with the crystalline silicon substrate 200 and continuing out towards the outer surface of the n+-type layer 206. Thus, directional solid phase crystallization takes place. As this crystallization occurs, the amorphous silicon assumes the same grain structure as that of the underlying crystalline silicon substrate 200. Also, the dopants are electrically activated during this anneal.

In one embodiment, as shown at step 115, after annealing, a passivation layer 207 (FIG. 2D), such as a dielectric, is deposited on the n+-type layer 206 in the same chamber or in a different similar chamber using conventional processes. In one embodiment, the passivation layer 207 may comprise silicon nitride. In another embodiment, the passivation layer 207 may comprise silicon oxide. In one embodiment, the passivation layer 207 is a silicon nitride layer deposited at a film thickness of about 850 Å. In one embodiment, a single layer of silicon nitride is deposited onto the n+-type layer 206. In another embodiment, the passivation layer may comprise two or more layers.

At step 116, the resulting structure is then passed on to a metallization process wherein metal contacts 208 (FIG. 2D) may be applied to the front surface of the substrate. This metallization process can be the standard screen printing process used in the industry. Alternatively, the front contacts 208A can be opened with laser ablation or other suitable processes followed by metallization using selective plating with nickel using electroless plating followed by silver or copper plating. As is well known in the art, the back surface 200B of the solar cell 211 (FIG. 2D) may be covered with conductor 209 (FIG. 2D), such as aluminum or other metal, which provides contact for good conduction as well as high reflectivity. The metal contacts 208 are formed so that they contact the n+-type layer 206. The conductor 209 is applied so that the back conductor makes contact with the p+-type layer 204 at the smaller substrate via 203 and the p-type layer 205 at the larger substrate via 202.

In an alternate embodiment, the crystalline silicon substrate may contain an n-type dopant, such as phosphorus. The crystalline silicon substrate may contain a higher level of phosphorus than silicon produced by the Siemens process. In this embodiment, the first layer of deposited amorphous silicon may be n-doped with a high concentration of phosphorus (n+ layer), the second layer of deposited amorphous silicon may be n-doped with a lower concentration of phosphorus (n layer), and the third layer of deposited amorphous silicon may be p-doped with a high concentration of boron (p+ layer). Additionally, the passivation layer(s), metal contacts, and back metal may be formed from materials similar to the ones discussed above.

Figure 3:
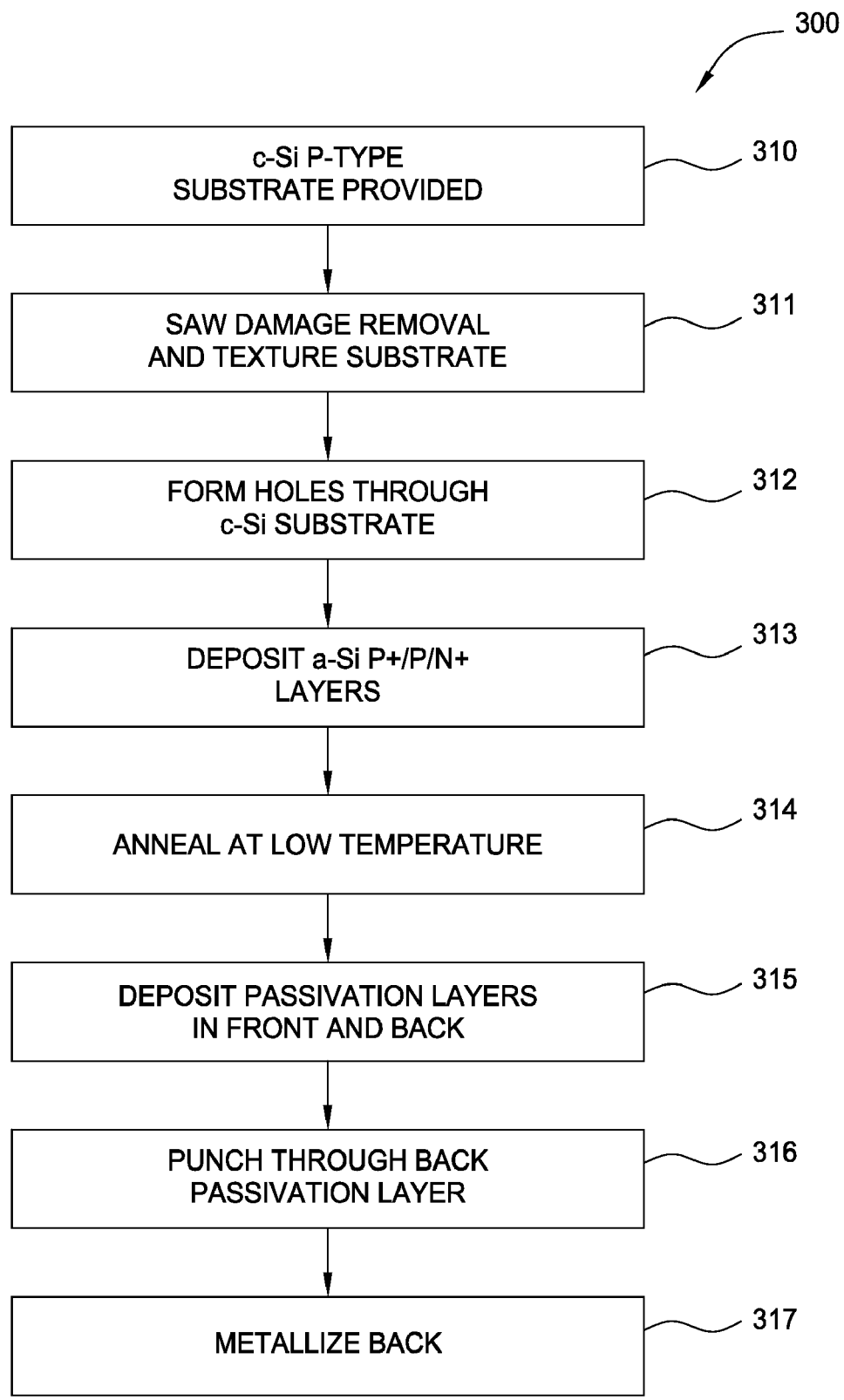
FIG. 3 is a process flow diagram showing the steps of another embodiment of a method of forming a solar cell in accordance with the principles of the present invention.

FIG. 3 depicts a process flow diagram illustrating an alternate embodiment of a method for forming a solar cell on a crystalline silicon (c-Si) substrate. FIGS. 4A-4D illustrate schematic cross-sectional views of substrate 400, such as a solar cell substrate, during different stages in processing sequence 300 discussed below in conjunction with FIG. 3. As is illustrated, there is provided a substrate 400 (FIG. 4A) at step 310, which may be a p-type upgraded metallurgical grade (UMG) crystalline silicon substrate. The UMG silicon may contain higher levels of a p-type dopant, such as boron, than silicon produced by the Siemens process. For example, the UMG silicon may contain boron at a concentration of about $1\times10^{16}$ atoms/cm$^3$ to about $1\times10^{19}$ atoms/cm$^3$. In one example, the UMG silicon may contain boron at a concentration of about $1\times10^{17}$ atoms/cm$^3$ to about $1\times10^{19}$ atoms/cm$^3$. In another embodiment, substrate 400 may be a p-type electronic grade substrate. While FIG. 3, and its associated discussion, primarily discuss the use of a p-type c-Si substrate, this configuration is not intended to be limiting as to the scope of the invention, since an n-type c-Si substrate may also be used without deviating from the basic scope of the invention described herein. In one embodiment, as shown at step 311, the substrate 400 may undergo saw damage removal and texturing using techniques known to those skilled in the art.

Figure 4A:
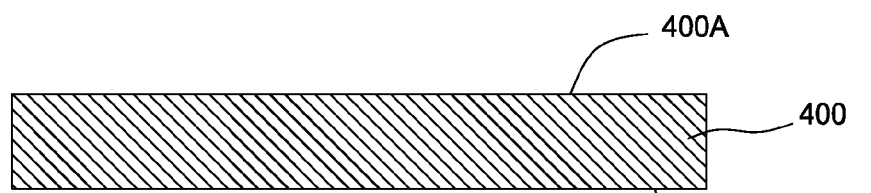
FIGS. 4A-4D illustrate schematic cross-sectional views of a solar cell substrate during different stages in the processing sequence shown in FIG. 3.
Figure 4B:
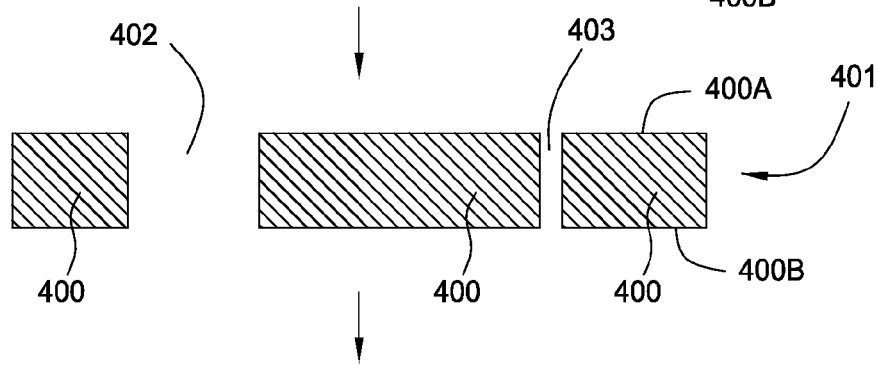
Figure 4C:
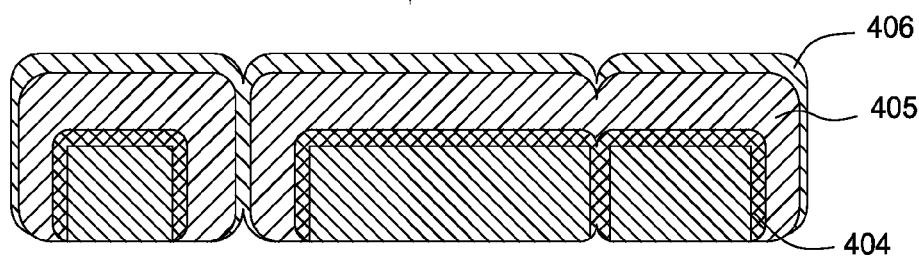
Figure 4D:
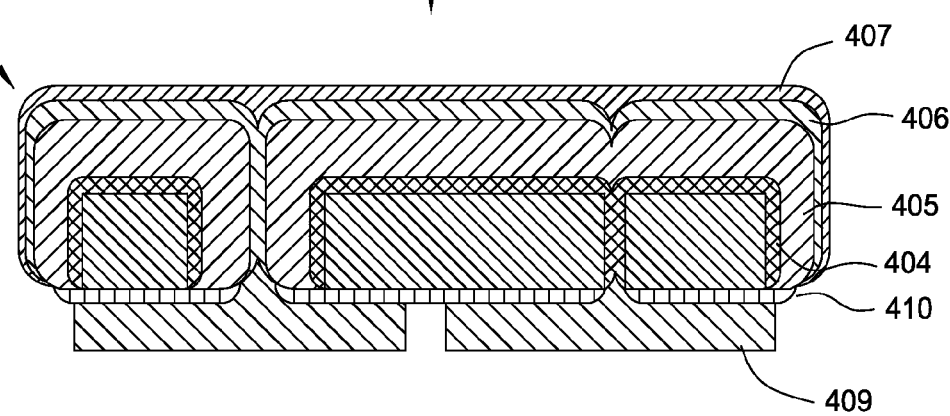

At step 312, vias are formed through the substrate 400 using, for example, laser ablation or water jet cutting. However, any suitable technique known in the art for forming vias through a silicon wafer may be used to form the perforated substrate 401 (FIG. 4B). In one embodiment, substrate vias of two desired diameters may be formed. In other embodiments, substrate vias of three, or more diameters may be formed. In FIG. 4B, only two substrate vias, larger substrate via 402 and smaller substrate via 403, are shown for clarity.

At step 313, the substrate 400 is placed inside a vacuum deposition chamber. As described above, a p-doped amorphous silicon layer with a heavy concentration of boron (p+-type layer 404) (FIG. 4C) is then deposited on a front surface 400A (FIG. 4B) of the substrate 400 and on surfaces within the larger substrate via 402 and the smaller substrate via 403. This first p+-type layer 404 will fill the smaller substrate via 403 of smaller diameter. Next, a lightly p-doped amorphous silicon layer (p-type layer 405) (FIG. 4C) is deposited on the first p+-type layer 404. A heavily n-doped amorphous silicon layer (n+-type layer 406) (FIG. 4C) is subsequently deposited on the second p-type layer 405. The n+-type layer 406 will fill, or completely close, any substrate vias of larger diameter, such as larger substrate via 402, that have not already been filled by the first p+-type layer 404 or the second p-type layer 405. The n+-type layer 406 will not reach the back surface 400B of substrate 400. In this embodiment, the desired larger substrate via diameter will be large enough so that, given a certain step coverage and amorphous silicon layer thicknesses, the n+-type layer will fill or completely close the larger substrate vias.

In one embodiment, the p+-type layer 404 of amorphous silicon may be deposited at a film thickness from about 3 to 10 microns, the p-type layer 405 of amorphous silicon may be deposited at a film thickness from about 20 to 30 microns, and the n+-type layer 406 of amorphous silicon may be deposited at a film thickness from about 0.3 to 1 microns. In one embodiment, substrate vias of two different desired diameters are formed, larger substrate via 402 and smaller substrate via 403. In one embodiment, for a deposition process having 70% step coverage, the smaller substrate via 403 can have a desired diameter of approximately 4 to 15 microns, and the larger substrate via 402 can have a desired diameter of approximately 40 to 60 microns, so that the smaller substrate via 403 is filled by the p+-type layer 404, while the larger substrate via 402 is finally, or completely, filled by the n+-type layer 406.

At step 314, the substrate 400 and the three layers of amorphous silicon, p+-type layer 404, p-type layer 405 and n+-type layer 406, may be directionally annealed at a temperature sufficient to crystallize the amorphous silicon layers and to electrically activate the dopants, but not so high as to cause the dopants, such as boron or phosphorus, or unwanted impurities to diffuse out of the substrate 400 and beyond the p+-type layer 404, as explained above. In one example, p+-type layer 404, the p-type layer 405 and the n+-type layer 406 may be converted by solid phase epitaxy. In another embodiment, the conversion of the deposited p+-type layer 404, the p-type layer 405 and the n+-type layer 406 can be accomplished by generating a temperature gradient across the substrate 400 with the deposited amorphous silicon layers thereon, as explained above.

At step 315, a passivation layer 407 (FIG. 4D), such as silicon nitride or silicon oxide, is deposited over the annealed stack on the front of the substrate assembly, and a passivation layer 410 (FIG. 4D), such as silicon oxide, is deposited on the back surface 400B of the substrate 400. In one embodiment, the passivation layer 407 comprises two or more layers. In another embodiment, either of the layers of the passivation layer 407 is formed from a compound selected from the group consisting of silicon nitride and silicon oxide. The passivation layer 410 may be formed using a process that does not cause appreciable diffusion of the dopant species, such as a rapid thermal oxidation process, an atmospheric pressure or low pressure CVD process, a plasma enhanced CVD process, a PVD process, or applied using a sprayed-on, spin-on, screen printed, or other similar type of deposition process. In one example, the passivation layer 410 may also comprise silicon oxide. In one embodiment, the passivation layer 410 is formed from silicon dioxide ($SiO_2$). Methods well known in the industry, such as laser ablation, dry etching, or wet etching, may then be used to remove portions of the passivation layer 410 through which electrical contacts to the p+-type fill in the smaller substrate via 403 and electrical contacts to the n+-type fill in the larger substrate via 402 can be formed (see step 316).

At step 317, the assembly is then passed on to a metallization process wherein a conducting layer 409 (FIG. 4D), such as aluminum (Al), is applied or deposited over the back surface 400B of the solar cell 411 (FIG. 4D) using methods well known in the industry, such as physical vapor deposition, or evaporation. The conducting layer 409 is then patterned using techniques well known in the art to form an interdigitated all back contact solar cell structure having two isolated regions so that the contact to the two types of silicon layers (the p+-type layer and the n+-type layer) are electrically isolated from each other.

Figure 5:
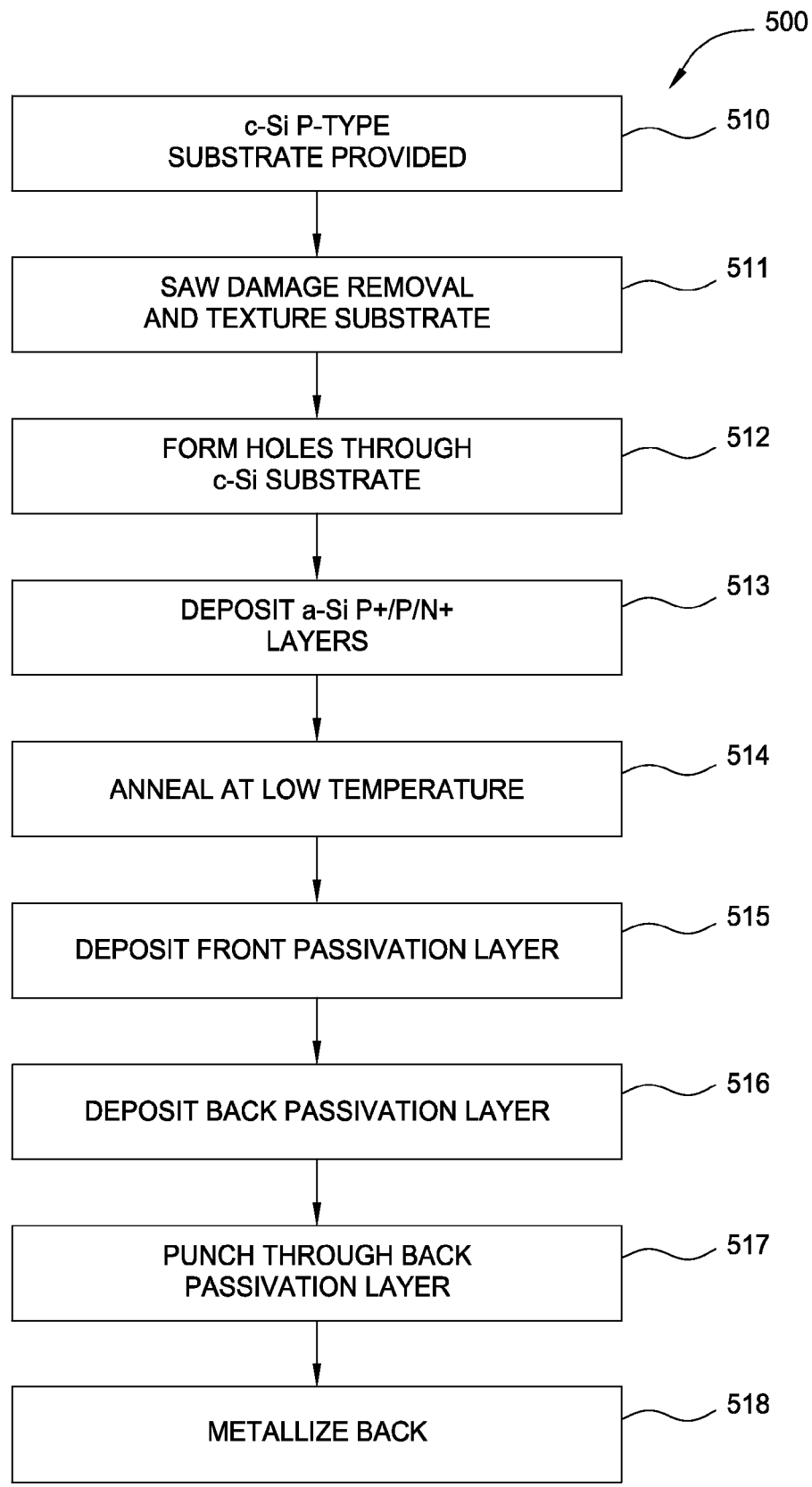
FIG. 5 is a process flow diagram showing the steps of yet another embodiment of a method of forming a solar cell in accordance with the principles of the present invention.
Figure 6:
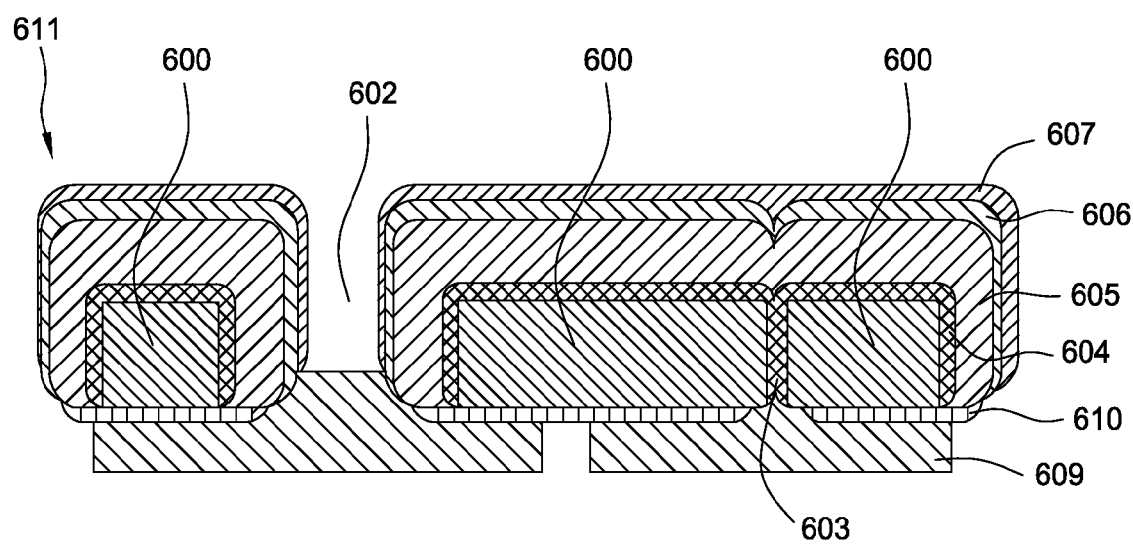
FIG. 6 illustrates a schematic cross-sectional view of a solar cell substrate during different stages in the processing sequence shown in FIG. 5.

FIG. 5 depicts a process flow diagram illustrating yet another embodiment of a method for forming a solar cell on a crystalline silicon substrate. FIG. 6 illustrates a schematic cross-sectional view of a complete solar cell 611 having features formed during different stages of a processing sequence 500 discussed below in conjunction with FIG. 5. As is illustrated, there is provided a substrate 600 at step 510, which may be a p-type UMG crystalline silicon (UMG-Si) substrate, as defined above. In one embodiment, as shown at step 511, the substrate 600 may undergo saw damage removal and texturing using techniques known to those skilled in the art, as explained above. At step 512, substrate vias may be formed through the substrate 600 using, for example, laser ablation or water jet cutting techniques. In one embodiment, substrate vias of two desired diameters may be formed. In FIG. 6, only two substrate vias, larger substrate via 602 and smaller substrate via 603, are shown for clarity.

At step 513, the substrate 600, now perforated, is placed inside a vacuum deposition chamber. As described above, a p-doped amorphous silicon layer (p+-type layer 604) (FIG. 6) with a heavy concentration of boron (p+-type layer) may then be deposited on a first surface of the crystalline silicon substrate and on surfaces within the larger substrate via 602 and the smaller substrate via 603. This first p+-type layer 604 may fill the smaller substrate via 603. Next, a lightly p-doped amorphous silicon layer (p-type layer 605) (FIG. 6) is deposited on the first p+-type layer 604. A heavily n-doped amorphous silicon layer (n+-type layer 606) (FIG. 6) is subsequently deposited on the second p-type layer 605. The desired larger substrate via diameter will be large enough so that, given a certain step coverage and amorphous silicon layer thicknesses, none of the amorphous silicon layers will fill the larger substrate via 602, but the outermost layer on the substrate will be the heavily doped n+-type layer. The p+-type layer 604, the p-type layer 605, and the n+-type layer 606 may be deposited using the processes discussed above in conjunction with step 113.

In one embodiment, the p+-type layer 604 of amorphous silicon may be deposited at a film thickness from about 3 to 10 microns, the p-type layer 605 of amorphous silicon may be deposited at a film thickness from about 20 to 30 microns, and the n+-type layer 606 of amorphous silicon may be deposited at a film thickness from about 0.3 to 1 micron. In one embodiment, substrate vias of two different desired diameters are formed, larger substrate via 602 and smaller substrate via 603. In one embodiment, for a deposition process having 70% step coverage, the smaller substrate via 603 can have a desired diameter of approximately 4 to 15 microns, and the larger substrate via 602 can have a desired diameter of approximately 40 to 60 microns so that the smaller substrate via 603 is filled by the p+-type layer 604, while the larger substrate via 602 is not filled by any of the three amorphous silicon layers.

At step 514, the substrate 600 and the three layers of amorphous silicon, p+-type layer 604, p-type layer 605, and n+-type layer 606, are annealed at a temperature sufficiently high to convert the amorphous silicon layers by solid phase epitaxy with little dopant diffusion and to electrically activate the dopants, but not so high as to cause the dopants, such as boron or phosphorus, or unwanted impurities to diffuse out of the substrate 600 beyond the p+-type layer 604, such as by the methods described above. In one example, the p+-type layer 604, the p-type layer 605 and the n+-type layer 606 may be converted by solid phase epitaxy. In another embodiment, the conversion of the p+-type layer 604, the p-type layer 605 and the n+-type layer 606 can be accomplished by generating a temperature gradient across the substrate 600 with the deposited amorphous silicon layers thereon, as explained above.

At step 515, a passivation layer 607 (FIG. 6) comprising silicon nitride or silicon oxide may be deposited over the annealed stack on the front of the substrate assembly. In one embodiment, the passivation layer 607 comprises two or more layers. In another embodiment, either of the layers of the passivation layer 607 is formed from a compound selected from the group consisting of silicon nitride and silicon oxide. At step 516, a passivation layer 610 (FIG. 6), such as a silicon oxide, is deposited on the back surface of the substrate 600 using techniques well known in the art, such as described above. Methods well known in the industry may then be used to remove portions of the passivation layer 610 through which electrical contacts to the p+-type fill in the smaller substrate via 603 and electrical contacts to the n+-type layer 606 in the larger substrate via 602 can be formed (see step 517).

At step 518, the assembly is then passed on to a metallization process wherein a conducting layer 609 (FIG. 6), such as aluminum (Al) or other metal, may be applied or deposited over the back surface of the solar cell 611 (FIG. 6) using methods well known in the industry to form an interdigitated all back contact solar cell structure so that the contact to the two types of silicon layers (the p+-type layer and the n+-type layer) are electrically isolated from each other. This includes patterning the conducting layer 609 to form two isolated regions by use of a material removal process, such as laser ablation, patterning and dry etching, or other similar techniques.

Although the invention has been described in accordance with certain embodiments and examples, the invention is not meant to be limited thereto. For instance, it should be noted that the desired substrate via diameters will depend on the step coverage and thicknesses of the layers of amorphous silicon deposited on the c-Si substrate. Also, the PECVD process described herein can be carried out using other chemical vapor deposition (CVD) chambers, adjusting the gas flows, pressure, plasma density, and the temperature so as to obtain high quality amorphous films at practical deposition rates. Additionally, embodiments of the present invention may be carried out via hot wire chemical vapor deposition (HWCVD), low pressure chemical vapor deposition (LPCVD), or physical vapor deposition (PVD). Furthermore, embodiments of the invention include scaling up or scaling down any of the process parameters or variables as described herein according to the number of substrates being utilized, chamber conditions, chamber sizes, and the like.

While the foregoing is directed to embodiments of the present invention, other and further embodiments of the invention may be devised without departing from the basic scope thereof, and the scope thereof is determined by the claims that follow.

The invention claimed is:

1. A method for forming a crystalline silicon solar cell comprising:
    forming vias of two different diameters through a crystalline silicon substrate from a first surface to a second surface;
    depositing a first silicon layer on the first surface of the crystalline silicon substrate and on surfaces within the vias, wherein the first silicon layer fills vias of lesser diameter;
    depositing a second silicon layer over the first silicon layer, wherein the second silicon layer fills vias of greater diameter;
    depositing a third silicon layer over the second silicon layer; and
    depositing a metallization layer on the second surface of the crystalline silicon substrate.

2. The method of claim 1, further comprising depositing a passivation layer on the third silicon layer prior to depositing the metallization layer on the second surface and forming metal contacts on selected areas of the third silicon layer.

3. The method of claim 2, wherein the passivation layer is formed from a compound selected from the group consisting of silicon nitride and silicon oxide.

4. The method of claim 1, wherein the crystalline silicon substrate is a p-type silicon substrate, the first silicon layer is a p+-type amorphous silicon layer, the second silicon layer is a p-type amorphous silicon layer and the third silicon layer is an n+-type amorphous silicon layer.

5. The method of claim 1, further comprising annealing the crystalline silicon substrate, prior to depositing the metallization layer, at a temperature sufficient to cause crystallization of the first, second and third silicon layers and to electrically activate dopants in the layers.

6. The method of claim 1, wherein the vias are formed by laser ablation.

7. The method of claim 1, wherein the vias of two different diameters comprise a first via having a diameter of about 4 microns to about 15 microns and a second via having a diameter of about 40 microns to about 60 microns.

8. The method of claim 1, wherein the second silicon layer is 20 to 30 microns thick.

9. The method of claim 1, further comprising removing saw damage from the substrate surfaces and texture etching the crystalline silicon substrate prior to forming the vias.

10. The method of claim 1, wherein the crystalline silicon substrate comprises an upgraded metallurgical grade crystalline silicon substrate having a concentration of boron or phosphorus of about $1 \times 10^{16}$ atoms/cm$^3$ to about $1 \times 10^{19}$ atoms/cm$^3$.

11. A method for forming a crystalline silicon solar cell comprising:
    forming vias of two different diameters through a crystalline silicon substrate from a first surface to a second surface;
    depositing a first silicon layer on the first surface of the crystalline silicon substrate and on surfaces within the vias, wherein the first silicon layer fills vias of lesser diameter;
    depositing a second silicon layer on the first silicon layer;
    depositing a third silicon layer on the second silicon layer, wherein the third silicon layer fills vias of greater diameter;
    depositing a passivation layer on the second surface of the substrate;
    patterning the passivation layer to expose portions of the first silicon layer and the third silicon layer; and
    depositing a conductive layer over the patterned passivation layer so that the conductive layer makes contact with the exposed regions of the first silicon layer in the vias of lesser diameter and the third silicon layer in the vias of greater diameter.

12. The method of claim 11, further comprising annealing the substrate, prior to depositing the passivation layer and depositing the conductive layer, at a temperature sufficient to cause crystallization of the first, second and third silicon layers and to electrically activate dopants in the layers.

13. The method of claim 12, further comprising depositing a second passivation layer on the third silicon layer after annealing.

14. The method of claim 12, further comprising depositing a second passivation layer on the third silicon layer after annealing, wherein the second passivation layer comprises two or more layers.

15. The method of claim 12, further comprising depositing a second passivation layer on the third silicon layer after annealing, wherein the second passivation layer comprises two or more layers and wherein either of the layers of the second passivation layer is formed from a compound selected from the group consisting of silicon nitride and silicon oxide.

16. The method of claim 11, wherein the crystalline silicon substrate is a p-type silicon substrate, the first silicon layer is a p+-type amorphous silicon layer, the second silicon layer is a p-type amorphous silicon layer and the third silicon layer is an n+-type amorphous silicon layer.

17. The method of claim 11, wherein the crystalline silicon substrate comprises an upgraded metallurgical grade crystalline silicon substrate having a concentration of boron or phosphorus of about $1 \times 10^{16}$ atoms/cm$^3$ to about $1 \times 10^{19}$ atoms/cm$^3$.

18. A method for forming a crystalline silicon solar cell comprising:
   forming vias of two different diameters through a crystalline silicon substrate from a first surface to a second surface;
   depositing a first silicon layer over the first surface of the crystalline silicon substrate and on surfaces within the vias, wherein the first silicon layer fills vias of lesser diameter;
   depositing a second silicon layer over the first silicon layer;
   depositing a third silicon layer over the second silicon layer, wherein vias of greater diameter remain open after deposition of the first, second and third silicon layers;
   depositing a passivation layer over the second surface of the crystalline silicon substrate;
   patterning the passivation layer to expose regions of the first silicon layer and the third silicon layer; and
   depositing a conductive layer over the patterned passivation layer so that the conductive layer contacts the exposed regions of the first silicon layer in the vias of lesser diameter and the third silicon layer in the vias of greater diameter.

19. The method of claim 18, further comprising depositing a second passivation layer on the third silicon layer prior to deposition of the passivation layer over the second surface.

20. The method of claim 19, wherein the second passivation layer comprises two or more layers.

21. The method of claim 19, wherein the second passivation layer comprises two or more layers, and wherein either of the layers of the second passivation layer is formed from a compound selected from the group consisting of silicon nitride and silicon oxide.

22. The method of claim 18, wherein the first layer is a p+-type amorphous silicon layer, the second layer is a p-type amorphous silicon layer, and the third layer is a n+-type amorphous silicon layer.

23. The method of claim 18, further comprising annealing the substrate, prior to depositing the passivation layer and depositing the conductive layer, at a temperature sufficiently low to cause solid phase epitaxial crystallization of the first, second, and third silicon layers and to electrically activate dopants in the layers.

24. The method of claim 18, wherein the crystalline silicon substrate comprises an upgraded metallurgical grade crystalline silicon substrate having a concentration of boron or phosphorus of about $1 \times 10^{16}$ atoms/cm$^3$ to about $1 \times 10^{19}$ atoms/cm$^3$.

* * * * *